United States Patent [19]
Cheek et al.

[11] Patent Number: 5,981,365
[45] Date of Patent: Nov. 9, 1999

[54] STACKED POLY-OXIDE-POLY GATE FOR IMPROVED SILICIDE FORMATION

[75] Inventors: Jon D. Cheek, Round Rock; Derick J. Wristers, Austin; Mark I. Gardner, Cedar Creek, all of Tex.

[73] Assignee: Advanced Micro Devices, Inc., Sunnyvale, Calif.

[21] Appl. No.: 09/037,530

[22] Filed: Mar. 10, 1998

[51] Int. Cl.$^6$ .................................................. H01L 21/285
[52] U.S. Cl. .......................... 438/592; 438/299; 438/301; 438/303; 438/305; 438/306; 438/307; 438/257; 438/585; 438/586; 438/588; 438/592; 438/595; 438/593; 438/655
[58] Field of Search ..................................... 438/299, 301, 438/303, 305, 306, 307, 257, 585, 586, 588, 592, 595, 593, 655

[56] References Cited

U.S. PATENT DOCUMENTS

| 4,900,257 | 2/1990 | Maeda | 437/200 |
|---|---|---|---|
| 5,352,631 | 10/1994 | Sitaram | 437/200 |
| 5,608,249 | 3/1997 | Gonzalez | 257/306 |
| 5,652,180 | 7/1997 | Shinriki | 437/190 |

OTHER PUBLICATIONS

Stanley Wolf and Richard N. Tauber, *Silicon Processing for the VLSI Era, vol. 2: Process Integration*, pp. 144–152, 1990.

Roger A. Haken; Application of the self-aligned titanium silicide process to very large-scale integrated n-metal-oxide-semiconductor and complementary metal-oxide- semiconductor technologies; J. Vac. Sci. Technol. B, vol. 3, No. 6; pp. 1657–1663; Nov./Dec. 1985.

R. M. Vadjikar et al.; The Effect of Processing Environment on the Lateral Growth of Titanium Silicide; J. Electrochem. Soc.: Solid–State Science and Technology, vol. 135, No. 10; pp. 2582–2586; Oct. 1988.

*Primary Examiner*—Benjamin Utech
*Assistant Examiner*—Matthew Anderson
*Attorney, Agent, or Firm*—Timothy M. Honeycutt

[57] ABSTRACT

A method of fabricating an integrated circuit transistor in a substrate is provided. A gate electrode stack is formed on the substrate. The stack has a first insulating layer, a first conductor layer on the first insulating layer, a second insulating layer on the first conductor layer, and a second conductor layer on the second insulating layer. First and second source/drain regions are formed in the substrate in spaced apart relation to define a channel region underlying the first insulating layer. First and second sidewall spacers are formed adjacent to the gate electrode stack. The second conductor layer and the second insulating layer are sacrificed and a silicide layer is formed on the first conductor layer. The void remaining after removal of the second conductor and insulating layers establishes a large separation between the silicide forming titanium layer and the first conductor layer. The result is a gate electrode stack that is resistant to lateral silicide formation due to silicon diffusion.

23 Claims, 5 Drawing Sheets

STACKED POLY-OXIDE-POLY GATE FOR IMPROVED SILICIDE FORMATION

BACKGROUND OF THE INVENTION

1. Field of the Invention

This invention relates generally to semiconductor processing, and more particularly, to a method of fabricating an integrated circuit transistor with an improved salicidation process.

2. Description of the Related Art

Insulated gate field effect transistors ("IGFET"), such as metal oxide semiconductor field effect transistors ("MOSFET"), are some of the most commonly used electronic components in modern integrated circuits. Embedded controllers, microprocessors, analog-to-digital converters, and many other types of devices now routinely include millions of MOSFETs. The dramatic proliferation of MOSFETs in integrated circuit design can be traced to their high switching speeds, potentially low power dissipation, and adaptability to semiconductor process scaling.

A typical MOSFET implemented in silicon consists of a source and a drain formed in a silicon substrate, and separated laterally to define a channel region in the substrate. A gate electrode composed of a conducting material, such as aluminum or polysilicon, is disposed over the channel region and designed to emit an electric field into the channel region. Changes in the electric field emitted by the gate electrode enable, or alternatively, disable the flow of current between the source and the drain.

In a conventional process flow for forming a typical MOSFET, a gate oxide layer is grown on a lightly doped silicon substrate and a layer of polysilicon is deposited on the gate oxide layer. The polysilicon and the gate oxide are then anisotropically etched back to the upper surface of the substrate leaving a polysilicon gate electrode stacked on top of a gate oxide layer. Following formation of the polysilicon gate electrode, a source and a drain are formed by implanting a dopant species into the substrate. The gate electrode acts as a hard mask against the implant so that the source and drain are formed in the substrate self-aligned to the gate electrode. Many conventional semiconductor fabrication processes employ a double implant process to form the source and drain. A first implant is performed self-aligned to the gate electrode to establish lightly doped drain ("LDD") structures. After the LDD implant, dielectric sidewall spacers are formed adjacent to the gate electrode by depositing and anisotropically etching a dielectric material, such as silicon dioxide. The second of the two source/drain implants is then performed self-aligned to the sidewall spacers. The substrate is then annealed to activate the dopant in the source and the drain. Salicidation steps frequently follow the formation of the source and drain.

In conventional salicidation, titanium is deposited on the gate, the sidewall spacers, and the source and drain regions. A one or two step anneal is performed to react the titanium with the polysilicon of the gate and the silicon of the source and drain regions to form $TiSi_2$. Following the anneal, an etch is performed to remove any unreacted titanium.

One of the principal functions of sidewall spacers is to separate the silicided gate from the source/drain regions. Despite the incorporation of spacers, silicide may form laterally and easily bridge the separation between the polysilicon gate electrode and the silicon source/drain regions causing the gate to become shorted to the source/drain regions. This so-called "bridging effect" occurs where silicon diffuses into the titanium regions that cover the sidewall spacers and subsequently reacts with the titanium.

Certain conditions tend to favor lateral $TiSi_2$ formation. Conventional furnace annealing in an inert gas atmosphere (e.g., argon for approximately 30 minutes) may foster rapid lateral $TiSi_2$ formation. Processing in the sub-0.25 $\mu m$ domain also appears to raise the frequency of lateral silicide formation. In sub-0.25 $\mu m$ processing, the minimum gate width may approach or even reach the dimensions of the grain boundaries between the individual grains of the polycrystalline silicon gate electrode. As the minimum device size approaches the dimensions of the grain boundaries in the polysilicon, the rate of silicon diffusion from the polysilicon into the titanium increases. The increased diffusivity is believed to stem from the elimination of pluralities of intersecting polysilicon grain boundaries that are present in larger scale processes. These grain boundaries act as natural barriers to silicon diffusion.

One method of controlling lateral $TiSi_2$ formation used in some fabs for several years involves the introduction of a $N_2$ ambient during the titanium anneal. Titanium absorbs a significant amount of nitrogen during the anneal, particularly at the titanium grain boundaries. The absorbed nitrogen clogs the grain boundary diffusion paths through the titanium. The result is a reduced diffusivity of silicon in the titanium and a suppression of the lateral $TiSi_2$ reaction. A drawback of the nitrogen anneal method is the requirement for a relatively oxygen and water free nitrogen ambient (less than 5 ppma). Higher concentrations of oxygen and/or water may yield unwanted oxidation of the titanium film. Another shortcoming associated with reliance upon a nitrogen ambient is that even with the absorption of nitrogen by the titanium, bridging may still occur in sub 0.25 $\mu m$ processing.

Another conventional method of suppressing lateral $TiSi_2$ formation involves careful tailoring of the anneal steps to reduce the potential for bridging. However, as is often the case in the thermal processing of integrated circuits in silicon, there are trade-offs in designing a thermal budget for a given process. Annealing titanium at higher temperatures generally produces a $TiSi_2$ layer with a lower sheet resistance. However, higher heating tends to exacerbate the potential for lateral $TiSi_2$ formation, and at temperatures above approximately 700° C., the titanium and silicon dioxide sidewall spacers may react to form titanium oxides. Any residues of this reaction can degrade device performance by compromising the integrity of the oxide or by producing bridging. This effect tends to be less severe in rapid thermal processing anneals. Conversely, lowering the anneal temperature can reduce the potential for lateral $TiSi_2$ formation, but often results in a higher sheet resistance for the $TiSi_2$ layer over the source and drain, and thus a lower performance integrated circuit. In short, achieving a suitable balance between anneal temperature, acceptable $TiSi_2$ sheet resistance, and lowered yields due to bridging is a difficult task and always subject to process variations.

The present invention is directed to overcoming or reducing one or more of the foregoing disadvantages.

SUMMARY OF THE INVENTION

In accordance with one aspect of the present invention, a method of fabricating an integrated circuit transistor in a substrate is provided. The method includes the step of forming a gate electrode stack on the substrate. The gate electrode stack has a first insulating layer, a first conductor layer on the first insulating layer, a second insulating layer on the first conductor layer, and a second conductor layer on the second insulating layer. First and second source/drain regions are formed in the substrate in spaced apart relation to define a channel region underlying the first insulating layer. First and second sidewall spacers are formed adjacent to the gate electrode stack. The second conductor layer and the second insulating layer are removed and a silicide layer is formed on the first conductor layer.

In accordance with another aspect of the present invention, a method of fabricating an integrated circuit transistor in a substrate that has a first insulating layer is provided. The method includes the steps of forming a first conductor layer on the first insulating layer, forming a second insulating layer on the first conductor layer, and forming a second conductor layer on the second insulating layer. First and second source/drain regions are formed in the substrate in spaced apart relation to define a channel region underlying the first insulating layer. First and second insulating sidewall spacers are formed on the substrate adjacent to the first conductor and insulating layers. The second conductor layer and the second insulating layer are removed and a silicide layer is formed on the first conductor layer.

In accordance with still another aspect of the present invention, a method of fabricating a gate electrode stack for an integrated circuit transistor in a substrate is provided. The method includes the steps of forming a first insulating layer on the substrate, forming a first conductor layer on the first insulating layer, and forming a second insulating layer on the first conductor layer. A second conductor layer is formed on the second insulating layer. First and second sidewall spacers are formed adjacent to the first and second insulating layers and the first and second conductor layers. The second conductor layer and the second insulating layer are removed and a silicide layer is formed on the first conductor layer.

In accordance with another aspect of the present invention, a method of fabricating an integrated circuit transistor in a substrate having a first insulating layer is provided. The method includes the steps of forming a first polysilicon layer on the first insulating layer, forming a silicon dioxide layer on the first polysilicon layer, and forming a second polysilicon layer on the silicon dioxide layer. First and second source/drain regions are formed in the substrate in spaced apart relation to define a channel region underlying the first insulating layer. First and second insulating sidewall spacers are formed on the substrate adjacent to the first and second polysilicon layers and the silicon dioxide layer. The second polysilicon layer and the silicon dioxide layer are removed and a silicide layer is formed on the first polysilicon layer.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
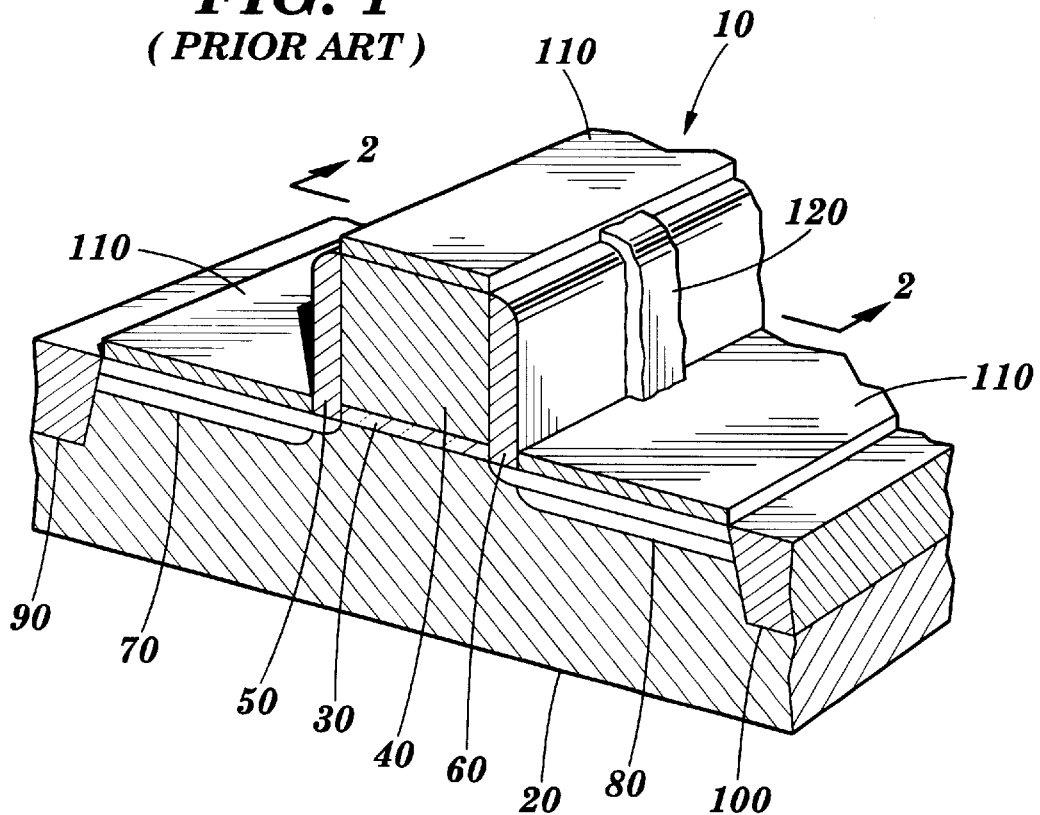
FIG. 1 is a cross-sectional pictorial view of an exemplary conventional integrated circuit transistor formed with a TiSi$_2$ stringer.
Figure 2:
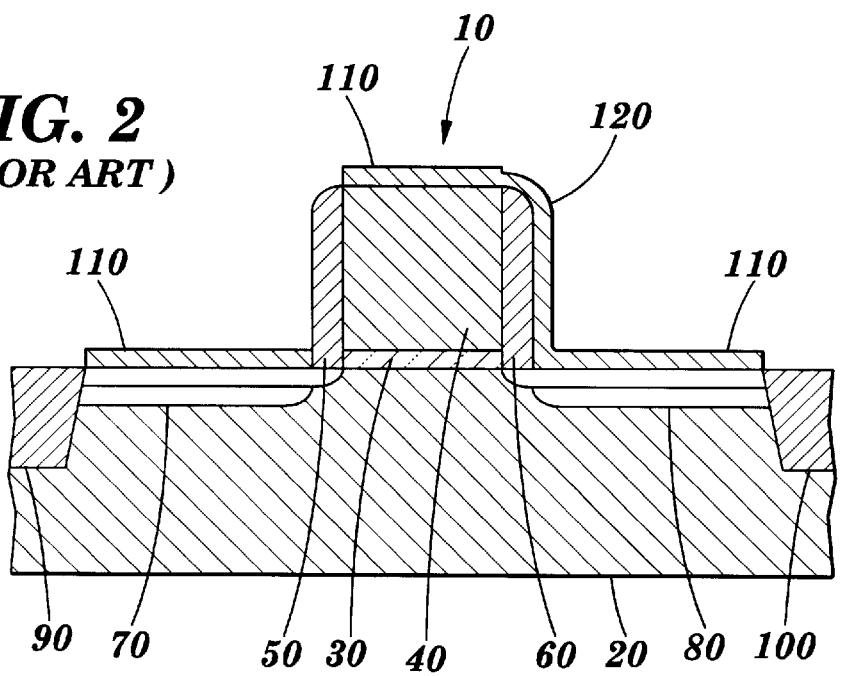
FIG. 2 is a cross-sectional view of FIG. 2 taken at section 2—2.

In the drawings described below, reference numerals are generally repeated where identical elements appear in more than one figure. Turning now to the drawings, and initially to FIGS. 1 and 2, there is shown a conventional MOSFET 10 formed on a silicon substrate 20. FIG. 1 is a pictorial cross-sectional view of the MOSFET 10 and FIG. 2 is a cross-sectional view of FIG. 1 taken at section 2—2. The MOSFET 10 includes a gate oxide layer 30 formed on the substrate 20 and a polysilicon gate electrode 40 formed on the gate oxide layer 30. Dielectric sidewall spacers 50 and 60 straddle the gate electrode 40 and the gate oxide layer 30. A source region 70 and a drain region 80 are formed in the substrate 20 and are generally self-aligned to the gate 40. Trench isolation structures 90 and 100 in the substrate 20 separate the MOSFET 10 from other structures in the substrate 20.

The MOSFET 10 is depicted immediately following a conventional salicidation process using titanium as the silicide forming material. A layer 110 of TiSi$_2$ is formed over the source region 70, the gate 40, and the drain region 80. To illustrate the problem of bridging, it is assumed that lateral formation of TiSi$_2$ occurred during the salicidation process, resulting in the formation of a stringer 120 composed of TiSi$_2$ that bridges the portion of the TiSi$_2$ layer 110 overlying the gate electrode 40 to the portion of the TiSi$_2$ layer 110 overlying the drain region 80. Like the TiSi$_2$ layer 110 overlying the gate 40 and the source and drain 70 and 80, the stringer 120 is left behind following an etch to remove any unreacted titanium from the sidewall spacers 50 and 60.

Figure 3:
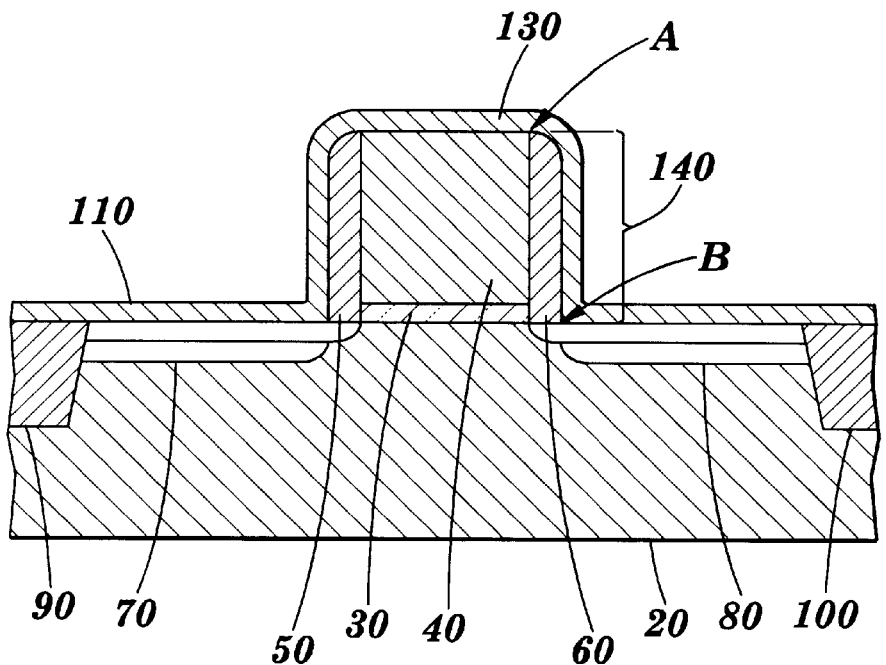
FIG. 3 is a cross-sectional view like FIG. 2 depicting the transistor of FIG. 1 prior to the silicide reaction.

As noted above, formation of a stringer, such as the stringer 120, is the by-product of unwanted diffusion of silicon into the titanium. An illustrative pathway for stringer-forming silicon diffusion into the titanium in the MOSFET 10 may be understood by referring now to FIG. 3. FIG. 3 is a cross-sectional view like FIG. 2, but depicts the MOSFET 10 after deposition of a titanium layer 130, and prior to the silicide reaction. Although it is theoretically possible for silicon to diffuse from the gate 40 and drain region 80 into the titanium layer 130 at any point or points where silicon is in contact with the titanium 130, the shortest, and therefore the most potentially troubling pathway for the lateral formation of TiSi$_2$ is represented by the path between the point A extending down the vertical interface 140 between the sidewall spacer 60 and the titanium layer 130 and the point B at the intersection of the lower end of the sidewall spacer 60, the titanium layer 130, and the upper surface of the drain region 80. This relatively short pathway for lateral formation of TiSi$_2$ is made possible by the relatively close proximity of two sources of silicon, the polysilicon gate electrode 40, and the drain region 80, both in contact with a common source of titanium, the titanium layer 130.

Figure 4:
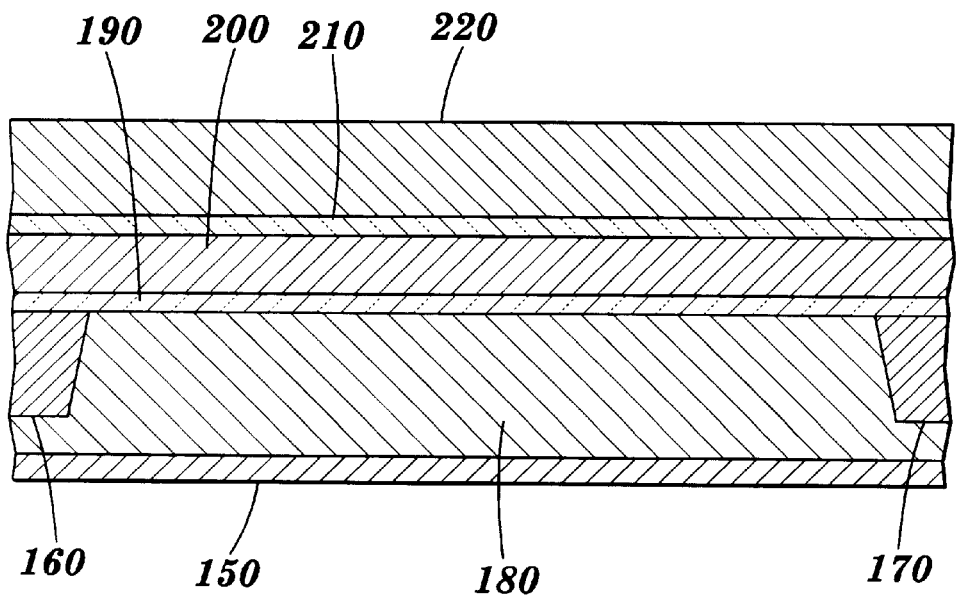
FIG. 4 is a cross-sectional view of a substrate and depicts formation of the constituents of a gate electrode stack in accordance with the present invention.

An exemplary process for forming an integrated circuit transistor in accordance with the present invention may be understood by referring now to FIG. 4, which is a cross-sectional view of a semiconductor substrate 150. The transistor formed in accordance with the present invention may be an IGFET, a MOSFET, or other type of transistor and may be n-channel or p-channel. For the purpose of illustration, the process will be described in the context of a n-channel transistor.

The substrate 150 may be composed of n-doped, or p-doped silicon, silicon-on-insulator, or other suitable substrate materials. The substrate 150 includes isolation trenches 160 and 170 to electrically isolate the transistor to be formed from other structures in the substrate 150. The isolation trenches 160 and 170 may be fabricated using well known techniques to fabricate isolation trenches, such as, for example, shallow trench isolation and reflow, deep trench isolation, or other suitable trench isolation techniques. The isolation trenches 160 and 170 are advantageously composed of a suitable dielectric material, such as an SiO$_2$ or other suitable dielectric trench isolation materials. Conventional LOCOS structures may be alternatively used to provide electrical isolation. A well 180 is formed in the substrate 150 and disposed generally between the trenches 160 and 170.

A first insulating layer 190 is formed on the substrate 150, and is advantageously composed of SiO$_2$, or other suitable gate oxide material. The first insulating layer 190 may be 20 to 35 Å thick and is advantageously about 25 Å thick. If SiO$_2$ is selected, the first insulating layer 190 may be grown by exposing the substrate 150 to an O$_2$ containing ambient at approximately 800 to 1050° C. for approximately 10 to 60 seconds in a rapid thermal anneal process ("RTA"), or for approximately 5 to 20 minutes in a diffusion tube process. A nitrogen bearing species, such as NO or N$_2$O, may be added to the ambient to infuse nitrogen into the layer 190 to inhibit polysilicon depletion and reduce hot carrier effects.

Prior to formation of the first insulating layer 190, implants to adjust the threshold voltage V$_T$ of the transistor to be formed and to inhibit punchthrough may be performed. The energy and dosage for the V$_T$ adjust and punchthrough inhibitor implants will depend on the dopant species. For p-type dopants, such as boron, the dosage for the threshold voltage adjust implant may be 2E12 to 7E12 ions/cm$^2$ and is advantageously 7E12 ions/cm$^2$. The energy may be 10 to 30 keV and is advantageously 20 keV. For n-type dopants, such as phosphorus, the energy may be 30 to 70 keV and is advantageously 50 keV. For p-type dopants, such as boron, the dosage for the punchthrough inhibitor implant may be 1E12 to 1E13 ions/cm$^2$ and is advantageously 6E12 ions/cm$^2$. The energy may be 40 to 70 keV and is advantageously 50 keV. For n-type dopants, such as phosphorus, the energy may be 80 to 120 keV and is advantageously 100 keV.

A first conductor layer 200 is formed on the first insulating layer 190, and may be composed of a variety of conducting materials, such as, for example, amorphous silicon or polysilicon. In an exemplary embodiment, the first conductor layer 200 is polysilicon. Well known techniques for applying polysilicon, such as CVD, may be used to deposit the first conductor layer 200. In an exemplary embodiment, the polysilicon is deposited at or above about 625° C. to a thickness of 20 to 300 Å, and advantageously to about 160 Å.

A second insulating layer 210 is formed on the first conductor layer 200, and is advantageously composed of SiO$_2$, or other suitable dielectric materials. The second insulating layer 155 may be 10 to 50 Å thick and is advantageously about 10 Å thick. If SiO$_2$ is selected, the second insulating layer 210 may be formed using the same techniques described above in conjunction with the first insulating layer 190. As described below, the second insulating layer 210 serves as an etch stop during subsequent processing.

A second conductor layer 220 is formed on the second insulating layer 210. The second conductor layer 220 may be composed of the same materials and processed in the same way as described above in conjunction with the first conductor layer 200. In an exemplary embodiment, the second conductor layer 220 is polysilicon deposited at or above about 625° C. to a thickness of 1000 to 2000 Å, and advantageously to about 1300 Å.

Figure 5:
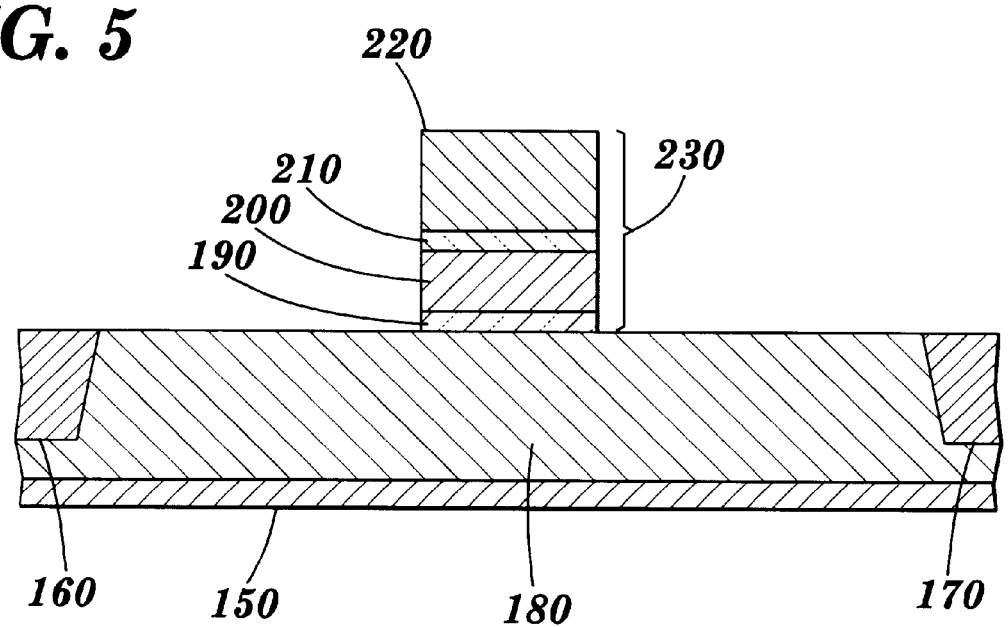
FIG. 5 is a cross-sectional view like FIG. 4 depicting definition of the gate electrode stack in accordance with the present invention.

Referring now to FIG. 5, the substrate 150 is masked with a photoresist, patterned, and anisotropically etched by reactive ion or plasma etching to yield a gate electrode stack 230. The total thickness of the gate electrode stack 230 will depend on thicknesses of the various constituent layers 190, 200, 210, and 220. In an exemplary embodiment, the gate electrode stack 230 is advantageously about 1500 Å thick.

Figure 6:
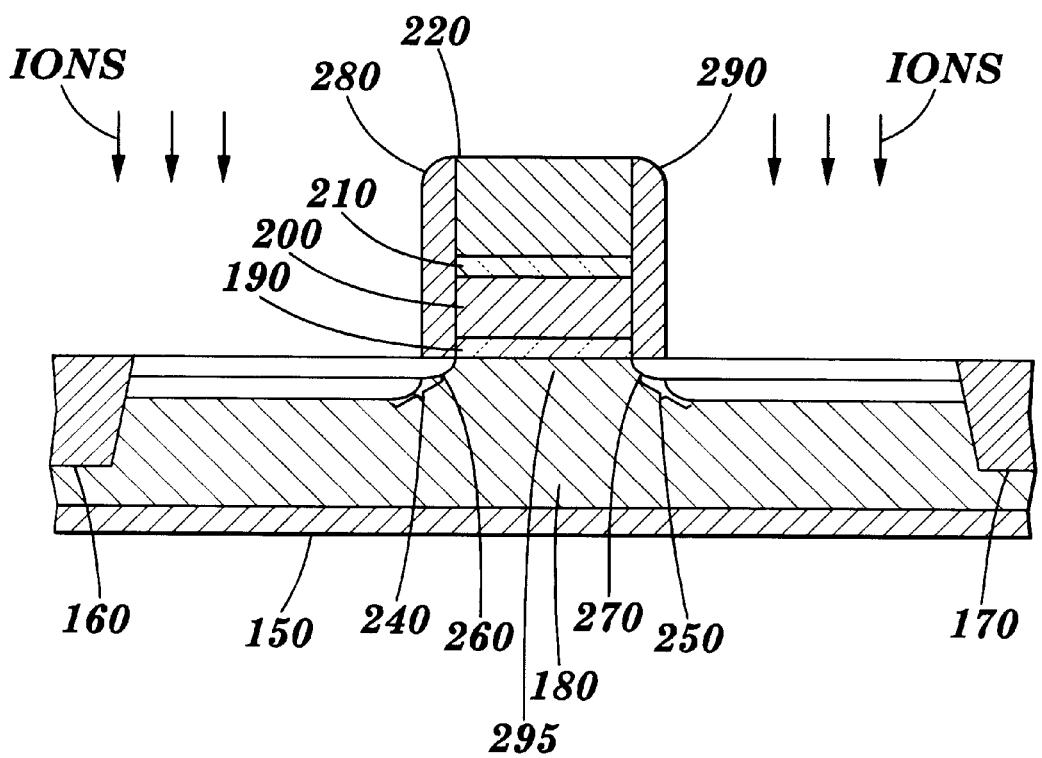
FIG. 6 is a cross-sectional view like FIG. 4 depicting formation of dielectric sidewall spacers in accordance with the present invention.

Referring now to FIG. 6, source/drain regions 240 and 250 are advantageously formed by ion implantation. The phrase "source/drain region(s)" is used herein to describe a region that may serve as either a source or a drain. The skilled artisan will appreciate that a source/drain region may function as a source or a drain depending upon whether it is connected to V$_{SS}$ or V$_{DD}$ during metallization. In an exemplary embodiment, a two-step implant is used. The substrate 150 is implanted with a dopant species to form the lightly doped drain ("LDD") structures 260 and 270 that are self-aligned to the gate electrode stack 230. The energy and dosage of the LDD implant will depend upon the dopant type. In an exemplary embodiment for n-channel, the dopant is arsenic. The dosage may be 5E13 to 8E14 ions/cm$^2$ and is advantageously 4E14 ions/cm$^2$. The energy may be 5 to 30 keV and is advantageously 20 keV. The implant angle is advantageously 0°.

Insulating sidewall spacers 280 and 290 are formed adjacent to the gate electrode stack 230 and may be composed of a suitable sidewall spacer material, such as, for example, SiO$_2$, Si$_3$N$_4$, or similar suitable sidewall spacer materials. The spacers 280 and 290 may be fabricated by forming a layer of the selected material by oxidation, chemical vapor deposition ("CVD"), or other technique, followed by anisotropic etching to leave the spacers 280 and 290. The spacers 280 and 290 are advantageously Si$_3$N$_4$, may be 200 to 800 Å wide and are advantageously about 500 Å wide.

Following formation of the sidewall spacers 280 and 290, a second implant is performed self-aligned to the sidewall spacers 280 and 290 to establish the source/drain regions 240 and 250. The energy and dosage of the S/D implant will depend upon the dopant type. In an exemplary embodiment, the dopant is arsenic. The dosage may be 2E15 to 7E15 ions/cm$^2$ and is advantageously 4E15 ions/cm$^2$. The energy may be 5 to 50 keV and is advantageously 40 keV. The implant angle is advantageously 0°. Like the V$_T$ and punchthrough implants, the energy of the S/D and LDD implants will be proportionately different for different dopant species. The lateral spacing of the source/drain regions 240 and 250 defines a channel region 295 underlying the layer 190.

Figure 7:
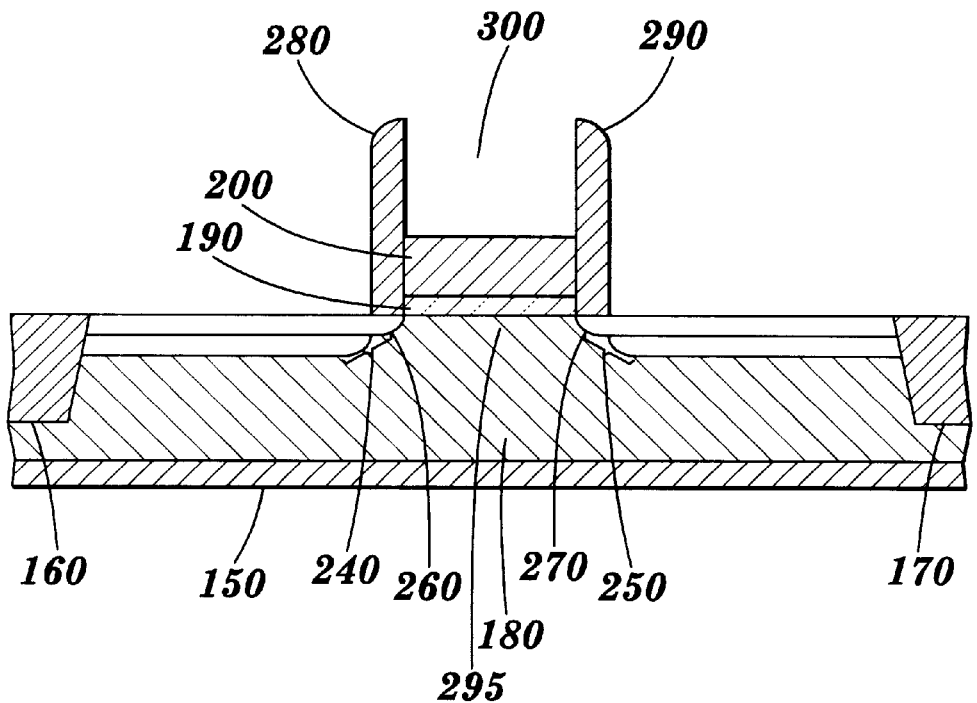
FIG. 7 is a cross-sectional view like FIG. 4 depicting removal of some of the constituent layers of the gate electrode stack in accordance with the present invention.

Referring now to FIG. 7, the second conductor layer 220 and the second insulating layer 210 are removed by etching. Plasma etching, reactive ion etching, or wet etching with an etchant, such as HF in a 10 to 1 or other suitable ratio, may be used. The second insulating layer 210 serves as an etch stop to protect the first conductor layer 200, independent of the particular etching process used to remove the layer 220. A void 300 is left between the spacers 280 and 290 and above the layer 200.

Figure 8:
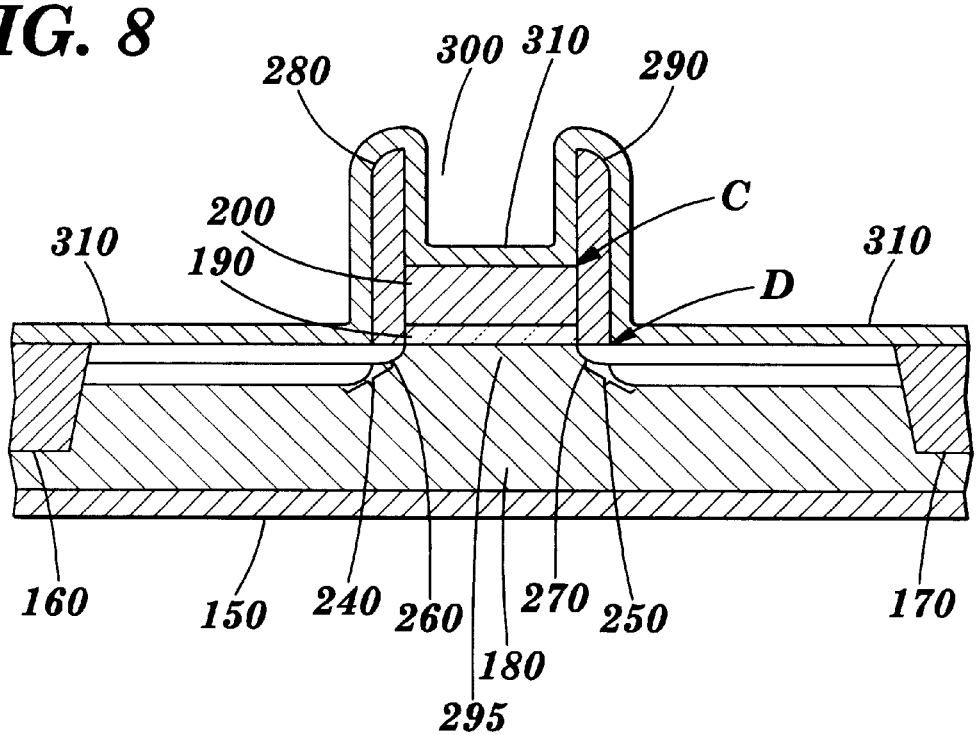
FIG. 8 is a cross-sectional view like FIG. 4 depicting deposition of a titanium layer in accordance with the present invention.

Enhanced ohmic contact between the first conductor layer 200, the source/drain regions 240 and 250, and subsequent metallization may be provided by salicidation. As shown in FIG. 8, a layer 310 of a suitable silicide forming material, such as titanium or other refractory metal, is deposited on the first conductor layer 200 and the source/drain regions 240 and 250 by CVD. The titanium layer 310 is annealed in an inert ambient at approximately 650 to 700° C. for approximately 30 to 60 seconds in a RTA. The inert gas may be $N_2$, argon or other suitable inert gas, and is advantageously $N_2$. In forming the silicide, it is desirable for the reaction to consume all or nearly all of the polysilicon of the layer 200. The silicide reaction follows a generally 1:2 ratio of titanium to polysilicon, that is, 1 Å of deposited titanium will react with and consume 2 Å of polysilicon. As the first conductor layer 200 may be 20 to 300 Å thick and is advantageously about 160 Å thick, the titanium layer 190 may be deposited to a thickness of 10 to 150 Å, and advantageously to about 80 Å.

Figure 9:
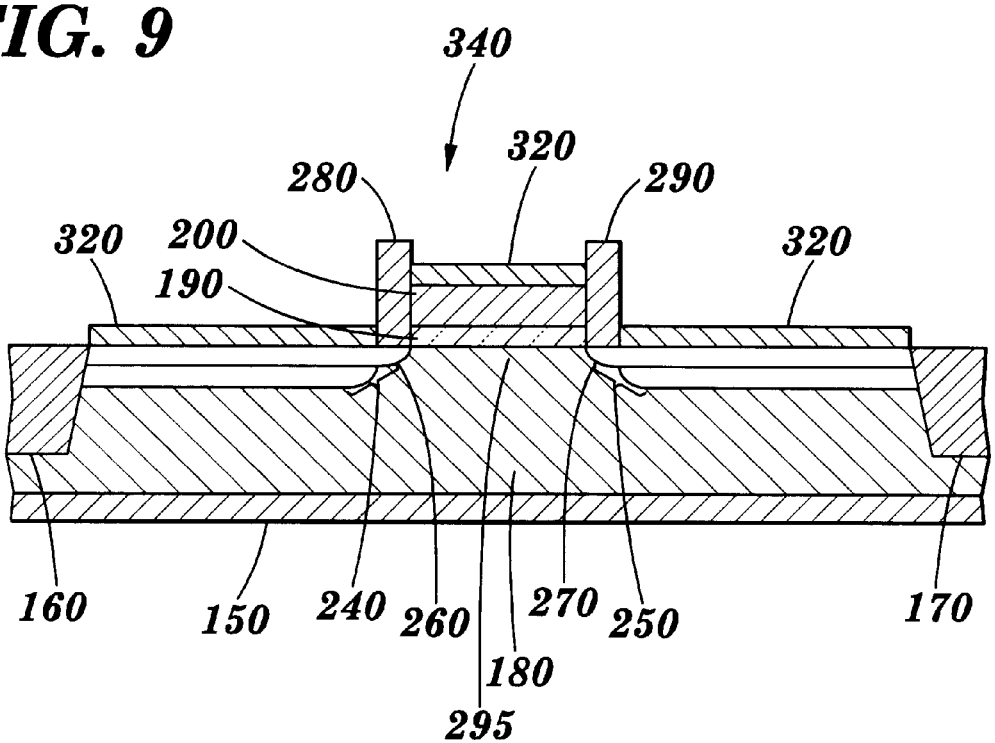
FIG. 9 is a cross-sectional view like FIG. 4 depicting formation of a silicide layer and planarization of the sidewall spacers in accordance with the present invention.

Referring now to FIG. 9, the substrate 150 may be subjected to RCA cleaning following silicide formation to remove any unreacted titanium. A final anneal is performed at approximately 700 to 800° C. for approximately 30 to 60 seconds to stabilize the silicide. The resulting silicide layer 320 may have a thickness of 250 to 500 Å and advantageously about 375 Å. The high temperature thermal steps to form the silicide layer 320 also serve to anneal the source/drain regions 240 and 250. Note that the arsenic dopant in the source/drain regions 240 and 250 will diffuse laterally beneath the first insulating layer 190, defining the channel region 295. The transistor 340 thus formed may be further processed to accommodate interlevel metallization as necessary.

Referring again to FIGS. 6 and 8, the process in accordance with the present invention provides for silicide and integrated circuit transistor formation with greater resistance to bridging than is possible in conventional processing. By forming and subsequently sacrificing the layers 210 and 220, the spacers 280 and 290 may be formed with peaks that are a considerable distance from the upper surface of the conductor layer 200. As a result, the shortest potential pathway for silicon diffusing from the layer 200 and/or the source/drain region 250 into the titanium layer 310 is between points C and D along the interface between the spacer 290 and the layer 310. Note that this pathway is considerably longer than the potential pathway established in a conventional process, as represented by the pathway between points A and B in FIG. 3.

Referring again to FIG. 9, the spacers 280 and 290 may be planarized back by chemical-mechanical-polishing ("CMP") or other planarization techniques to provide a more planar structure. The ultimate height of the spacers is a matter of design discretion. In an exemplary embodiment, the spacers may be planarized back to between 50 and 100 Å, and advantageously to 75 Å above the upper surface of the silicide layer 320 overlying the first conductor layer 200.

The skilled artisan will appreciate that shallow source/drain junctions are often desirable from a performance standpoint, particularly in short channel transistors. However, the consumptive nature of the silicide reaction often makes implementation of shallow junction depths difficult. Most design rules require the source/drain implant to be performed to a greater than optimal depth in order to avoid compromise of the junction by the invading silicide.

Figure 10:
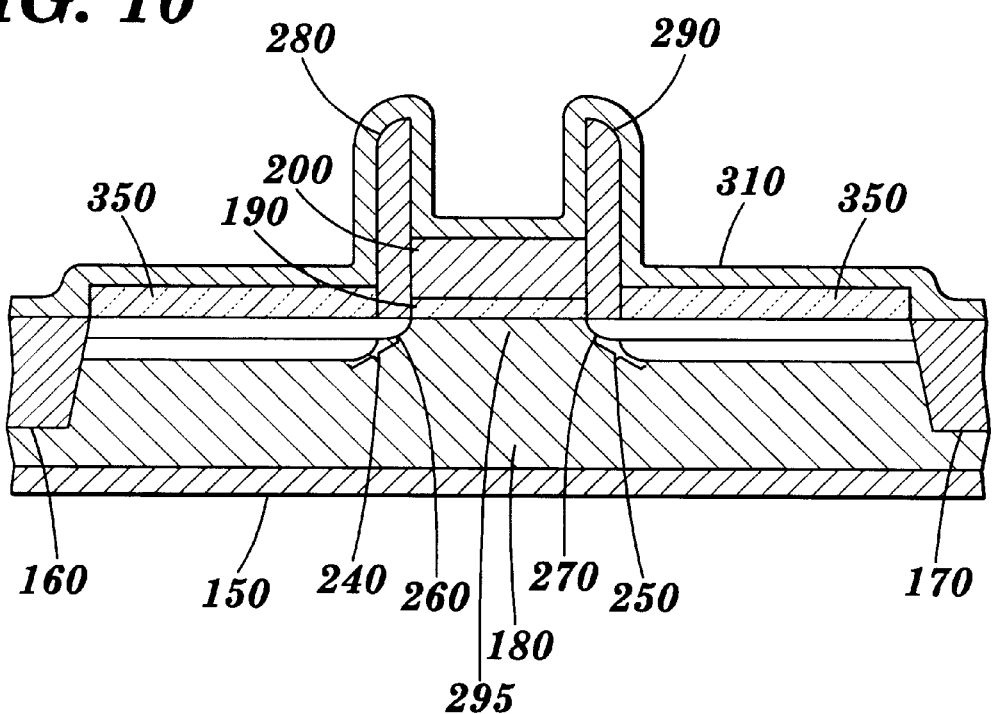
FIG. 10 is a cross-sectional view like FIG. 8 depicting an alternate embodiment of the process incorporating silicon layers adjacent to the gate stack in accordance with the present invention.

FIG. 10 is a cross-sectional view like FIG. 8 and depicts an alternate embodiment of the process in accordance with the present invention that enables shallow positioning of the source/drain junction. As shown in FIG. 10, a silicon layer 350 may be formed on the substrate 150 following the LDD implant but prior to the second source/drain implant and deposition of the titanium layer 310. The layer 350 may be formed via selective epitaxial growth or other suitable techniques. The layer 350 may be 400 to 700 Å thick and is advantageously 550 Å thick. Following formation of the layer 350, the second source/drain implant may be performed and the titanium layer 310 may be applied and the silicide layer 320 formed as shown in FIGS. 8 and 9. The titanium layer 310 reacts with the silicon layer 350 to form silicide with little or no invasion of the substrate 150. Accordingly, the second source/drain implant may be tailored to establish a shallow junction with protection against silicide compromise. The energy for the second implant may be 30 to 60 keV and is advantageously 40 keV and the dosage as described above.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating an integrated circuit transistor in a substrate, comprising the steps of:

forming a gate electrode stack on the substrate, the gate electrode stack having a first insulating layer, a first conductor layer on the first insulating layer, a second insulating layer on the first conductor layer, and a second conductor layer on the second insulating layer;

forming first and second source/drain regions in the substrate in spaced apart relation to define a channel region underlying the first insulating layer;

forming first and second sidewall spacers adjacent to the gate electrode stack;

removing the second conductor layer and the second insulating layer;

forming a silicide layer on the first conductor layer.

2. The method of claim 1, wherein the step of forming the gate electrode stack comprises depositing polysilicon to form the first and second conductor layers.

3. The method of claim 1, wherein the step of forming the silicide layer comprises depositing titanium on the first conductor layer and reacting the titanium with the first conductor layer to form titanium silicide.

4. The method of claim 1, comprising the step of planarizing the first and second sidewall spacers substantially to the silicide layer.

5. The method of claim 4, wherein the planarizing is by chemical mechanical polishing.

6. The method of claim 1, comprising the step of forming a layer of silicon over the first and second source/drain regions prior to forming the silicide layer.

7. A method of fabricating an integrated circuit transistor in a substrate having a first insulating layer, comprising the steps of:
   forming a first conductor layer on the first insulating layer;
   forming a second insulating layer on the first conductor layer;
   forming a second conductor layer on the second insulating layer;
   forming first and second source/drain regions in the substrate in spaced apart relation to define a channel region underlying the first insulating layer;
   forming first and second insulating sidewall spacers on the substrate adjacent to the first conductor and insulating layers;
   removing the second conductor layer and the second insulating layer; and
   forming a silicide layer on the first conductor layer.

8. The method of claim 7, wherein the steps of forming the first and second conductor layers comprise depositing polysilicon to form the first and second conductor layers.

9. The method of claim 7, wherein the step of forming the silicide layer comprises depositing titanium on the first conductor layer and reacting the titanium with the first conductor layer to form titanium silicide.

10. The method of claim 7, comprising the step of planarizing the sidewall spacers substantially to the silicide layer.

11. The method of claim 10, wherein the planarizing is by chemical mechanical polishing.

12. The method of claim 7, comprising the step of forming a layer of silicon over the first and second source/drain regions prior to forming the silicide layer.

13. A method of fabricating a gate electrode stack for an integrated circuit transistor in a substrate, comprising the steps of:
   forming a first insulating layer on the substrate;
   forming a first conductor layer on the first insulating layer;
   forming a second insulating layer on the first conductor layer;
   forming a second conductor layer on the second insulating layer;
   forming first and second sidewall spacers adjacent to the first and second insulating layers and the first and second conductor layers;
   removing the second conductor layer and the second insulating layer; and
   forming a silicide layer on the first conductor layer.

14. The method of claim 13 wherein the steps of forming the first and second conductor layers comprise depositing polysilicon to form the first and second conductor layers.

15. The method of claim 13, wherein the step of forming the silicide comprises depositing titanium on the first conductor layer and reacting the titanium with the first conductor layer to form titanium silicide.

16. The method of claim 13, comprising the step of planarizing the first and second sidewall spacers substantially to the silicide layer.

17. The method of claim 16, wherein the planarizing is by chemical mechanical polishing.

18. The method of claim 13, comprising the step of forming a layer of silicon on the substrate adjacent to the first and second sidewall spacers prior to forming the silicide layer.

19. A method of fabricating an integrated circuit transistor in a substrate having a first insulating layer, comprising the steps of:
   forming a first polysilicon layer on the first insulating layer;
   forming a silicon dioxide layer on the first polysilicon layer;
   forming a second polysilicon layer on the silicon dioxide layer;
   forming first and second source/drain regions in the substrate in spaced apart relation to define a channel region underlying the first insulating layer;
   forming first and second insulating sidewall spacers on the substrate adjacent to the first and second polysilicon layers and the silicon dioxide layer;
   removing the second polysilicon layer and the silicon dioxide layer; and
   forming a silicide layer on the first polysilicon layer.

20. The method of claim 19, wherein the step of forming the silicide layer comprises depositing titanium on the first polysilicon layer and reacting the titanium with the polysilicon to form titanium silicide.

21. The method of claim 19, comprising the step of planarizing the sidewall spacers substantially to the silicide layer.

22. The method of claim 21, wherein the planarizing is by chemical mechanical polishing.

23. The method of claim 19, comprising the step of forming a layer of silicon over the first and second source/drain regions prior to forming the silicide layer.

* * * * *